(12) United States Patent
Crouse

(10) Patent No.: US 7,255,782 B2
(45) Date of Patent: Aug. 14, 2007

(54) SELECTIVE CATALYTIC ACTIVATION OF NON-CONDUCTIVE SUBSTRATES

(76) Inventor: Kenneth Crouse, 18 Cinnamon Rd., Newington, CT (US) 06111

( * ) Notice: Subject to any disclaimer, the term of this patent is extended or adjusted under 35 U.S.C. 154(b) by 226 days.

(21) Appl. No.: 10/837,109

(22) Filed: Apr. 30, 2004

(65) Prior Publication Data

US 2005/0241949 A1    Nov. 3, 2005

(51) Int. Cl.
C25D 5/02 (2006.01)
C25D 5/54 (2006.01)
C23C 28/00 (2006.01)

(52) U.S. Cl. ............... 205/163; 205/118; 205/187; 427/98.1; 427/98.2; 427/98.4

(58) Field of Classification Search ......... 205/118, 205/159, 163, 170, 183, 187; 427/98.1–98.2, 427/98.4, 306
See application file for complete search history.

(56) References Cited

U.S. PATENT DOCUMENTS

| | | |
|---|---|---|
| 3,414,427 A | 12/1968 | Levy |
| 3,937,857 A | 2/1976 | Brummett et al. |
| 4,080,246 A * | 3/1978 | Battisti et al. ............... 216/103 |
| 4,089,993 A | 5/1978 | Shirahata et al. |
| 4,368,281 A | 1/1983 | Brummett et al. |
| 4,560,445 A | 12/1985 | Hoover et al. |
| 4,910,072 A | 3/1990 | Morgan et al. |
| 5,076,841 A | 12/1991 | Chen et al. |
| 5,288,313 A | 2/1994 | Portner |
| 5,340,946 A | 8/1994 | Friedrich et al. |
| 5,378,268 A | 1/1995 | Wolf et al. |
| 5,685,898 A | 11/1997 | Dupuis et al. |
| 5,763,058 A | 6/1998 | Isen et al. |
| 6,288,905 B1 | 9/2001 | Chung |
| 6,356,234 B1 | 3/2002 | Harrison et al. |
| 6,404,643 B1 | 6/2002 | Chung |
| 6,421,013 B1 | 7/2002 | Chung |
| 6,461,678 B1 | 10/2002 | Chen et al. |

(Continued)

FOREIGN PATENT DOCUMENTS

WO    WO 00/33625    6/2000

(Continued)

OTHER PUBLICATIONS

Encyclopedia of Polymer Science and Technology: Plastics, Resins, Rubbers, Fibers. vol. 4, 1966, p. 528.*

*Primary Examiner*—Nam Nguyen
*Assistant Examiner*—Luan V. Van
(74) *Attorney, Agent, or Firm*—Carmody & Torrance LLP

(57) ABSTRACT

A process of providing a pattern of a metal on a non-conductive substrate to create loop antennae for wireless articles and for creating circuitry for smart cards, such as phone cards is provided. The method comprises the steps of catalyzing the non-conductive substrate by applying a catalytic ink, reducing a source of catalytic metal ions in the catalytic ink to its associated metal, depositing electroless metal on the pattern of catalytic ink on the surface of the substrate; and plating electrolytic metal on the electroless metal layer to produce the desired pattern of metal on the non-conductive substrate. The catalytic ink typically comprises one or more solvents, a source of catalytic metal ions, a crosslinking agent, one or more copolymers, a polyurethane polymer, and, optionally, one or more fillers.

59 Claims, 2 Drawing Sheets

U.S. PATENT DOCUMENTS

| | | |
|---|---|---|
| 6,586,492 B1 | 7/2003 | Caiger et al. |
| 6,593,167 B2 | 7/2003 | Dobashi et al. |
| 6,662,430 B2 | 12/2003 | Brady et al. |
| 6,665,193 B1 | 12/2003 | Chung et al. |

FOREIGN PATENT DOCUMENTS

| | | |
|---|---|---|
| WO | WO 01/69717 A1 | 9/2001 |
| WO | WO 02/096168 A2 | 11/2002 |

* cited by examiner

SELECTIVE CATALYTIC ACTIVATION OF NON-CONDUCTIVE SUBSTRATES

FIELD OF THE INVENTION

The present invention relates to improved methods for patterning non-conductive substrates with electrolytic metals. The patterned substrates of the invention are used to create loop antennae for wireless articles, and to create circuitry for phone cards.

BACKGROUND OF THE INVENTION

Many electronic applications require patterned metallization of nonconductive substrates for interconnection among electronic devices. Examples of such applications include high-density packaging (multi-chip modules), antennas, flex circuits, printed wiring boards, and flat panel displays.

Radio Frequency Identification (RFID) is a type of automatic identification system. The purpose of an RFID system is to enable data to be transmitted by a portable device, called a tag, which is read by an RFID reader and processed according to the needs of a particular application. A basic RFID system consist of three components:

An antenna or coil

A transceiver (with decoder)

A transponder (RF tag) electronically programmed with unique information

Wireless articles, including tags, identification badges, smart cards, etc., are in wireless communication with a base unit or reader via a radio-frequency (RF) communication link. These articles can be used for electronic identification and tracking of articles, persons and transactions. RF transmissions transmitted by the base unit may be received by an antenna on the wireless article, or RF transmissions transmitted by the wireless article by an antenna thereon may be received by the base unit, or RF transmissions by each of the wireless article and the base unit may be received by the other one thereof.

RFID tags are categorized as either active or passive. Active RFID tags are powered by an internal battery and are typically read/write, i.e., tag data can be rewritten and/or modified. An active tag's memory size varies according to application requirements. Passive RFID tags operate without a separate external power source and obtain operating power generated from the reader.

The significant advantage of all types of RFID systems is the noncontact, non-line-of-sight nature of the technology. Tags can be read through a variety of substances such as snow, fog, ice, paint, crusted grime, and other visually and environmentally challenging conditions, where barcodes or other optically read technologies would be useless.

In each case, the RF signals either received or transmitted by the wireless article are received or transmitted by an antenna thereon. Because wireless articles are usually desired to be small in size, the antenna thereon is also small in size. The conductive coil pattern of the RF antenna allows the antenna to receive and radiate energies in the radio frequency range. The sensitivity of the antenna to small amplitude RF signals and the amplitude of the RF signals transmitted by the antenna are a direct function of the area enclosed by the antenna loop and the number of turns of the conductor forming the loop. For a small tag or badge, the size limits the area that an antenna loop can enclose, thereby limiting the RF performance of the antenna. Typically, the antenna is optimized to transmit and receive energy in a relatively narrow portion of the radio frequency range.

Often, the radio frequency antenna is connected to an integrated circuit. The integrated circuit receives energy from a detector unit, modulates the energy with an identification pattern stored in the integrated circuit, and then retransmits the modulated energy to the detector unit. RF identification tags typically operate in the frequency range of 100 KHz to 3 GHz, or higher.

Various methods of assembling wireless articles and of forming RF antennae and circuitry on such articles are described in the prior art.

U.S. Pat. No. 6,333,721 to Altwassen, the subject matter of which is herein incorporated by reference in its entirety, describes a method of forming an RF antenna by stamping a conductive coil out of a sheet of metal. The drawback of this method is that the production of the metal coil may result in a large amount of scrap metal. In addition, the RF antennae produced by stamping from a sheet of metal may be less flexible than desired for many applications.

Another way that has been suggested for forming RF antennae is to use strip-back techniques that are commonly used in printed circuit board fabrication. In printed circuit board fabrication, a layer of conductive material, i.e., metal, is formed on top of the substrate and the areas not used for the antenna are stripped away. This method tends to be wasteful when used to produce radio frequency antennae, because the radio frequency coil antenna tends to cover only about 10% of the surface area of the substrate. In contrast, typical printed circuit board implementations require coverage areas of about 70-80%.

Still another way of forming RF antennae on non-conductive substrates is described in U.S. Pat. No. 6,662,430 to Brady et al., the subject matter of which is herein incorporated by reference in its entirety, wherein electrical circuitry is connected to an antenna, which is made of a composite material, and the composite material is connected to electrical circuitry at points. The antenna is made by screening a paste of metal powder, polymer material, and solvent through a screen onto a substrate. While the paste is still wet, the electrical circuitry is bonded to the material by contacting electrical contacts of the electrical circuitry with the wet paste, and then driving off the solvent and/or curing the polymer matrix material.

WO 01/69717 to RCD Technology, Inc., the subject matter of which is herein incorporated by reference in its entirety, describes a process of forming RF antennae using conductive inks. The conductive ink is printed in a RF antenna coil pattern on top of the substrate, and is then cured. The printed antennae may then be used as is or electrodes may be attached to the conductive ink pattern and a metal layer then electroplated on top of the conductive ink pattern.

A fundamental problem with RF tags and identification devices is that the cost of the tag/card must be reduced to a level small compared to the cost of the product to which the tag is attached, which will then allow many more tags to be used and so that high volume production can cut the costs even further. The cost of the tags is the cost of the semiconductor chip, the antenna, the substrate supporting the antenna and chip, and the attachment cost. As the use such devices becomes more and more widespread, there remains a need in the art for greater efficiency in the process while reducing the cost of production.

The inventors of the present invention have discovered that antennae and circuitry may advantageously be produced by using a novel catalytic ink formulation for forming the antennae and circuitry, which may then be plated with an electroless plating composition followed by an electrolytic plating composition.

While catalytic ink formulations and plating catalysts have been widely disclosed in the prior art, there remains a need in the art for improved catalytic ink formulations that can be used for forming RF antennae and phone card circuitry.

U.S. Pat. No. 3,414,427 to Levy, the subject matter of which is herein incorporated by reference in its entirety, describes a method of catalyzing a surface of a material to be plated by a chemical reduction plating process. The method uses a catalyst comprising a complex of palladium chloride dissolved in an organic solvent (i.e., acetone). However the catalyst is not very effective in catalyzing non-conductive (plastic) substrates.

U.S. Pat. No. 4,368,281 to Brummett et al., the subject matter of which is herein incorporated by reference in its entirety, describe a process for making flexible printed circuits on flexible substrates. Brummett et al. describe an ink formulation comprising an appropriate coordination complex of palladium. This complex is depicted by a formula $L_mPdX_n$, wherein L is a ligand or unsaturated organic group, Pd is a palladium metal base of the complex, X is a halide, alkyl group, or bidentate ligand and m and n are integers wherein m is from 1 to 4 and n is from 0 to 3. However, there is no suggestion that the catalytic ink formulation described by Brummett et al. can be used for forming RF antennae and circuitry for wireless articles.

U.S. Pat. No. 5,288,313 to Portner, the subject matter of which is herein incorporated by reference in its entirety, describes a plating catalyst that comprises a mixture of catalytic particles dispersed in a liquid coating composition, and is useful for the formation of selectively deposited metal coatings. The catalytic particles are formed from a reduced metal salt that is an electroless plating catalyst coated on an inert particulate carrier. The process of the invention permits plating at a good plating rate and results in a deposit that is and remains strongly adhered to its underlying substrate during prolonged use. However, the catalyst must be applied as a paste and the process further requires a step of solvating (i.e., softening) the non-conductive substrate prior to application of the catalyst.

U.S. Pat. No. 5,378,268 to Wolf et al., the subject matter of which is herein incorporated by reference in its entirety, describes a primer composition for chemical metallization of substrate surfaces without the necessity of prior etching with an oxidant. The primer composition comprises a) a film former based on a polyurethane system; b) an additive having a specific surface tension; c) an ionic and/or colloidal noble metal or organometallic covalent compound thereof; d) a filler; and e) a solvent. However, there is no suggestion that the primer described by Wolf et al. can be selectively applied to produce RF antennae or smart card circuitry.

U.S. Pat. No. 6,461,678 to Chen et al., the subject matter of which is herein incorporated by reference in its entirety also describes a process for applying a catalyst solution comprising a solvent, a carrier, and metal catalyst ions to the surface of a substrate. The catalyst solution can cover then entire surface of the substrate or can be selectively applied to only a portion of a surface of substrate. The concentration of solvent in the layer of catalyst solution on the surface of substrate can be reduced by heating the substrate. Metallic clusters can be formed in the remaining catalyst layer by further heating the substrate. Electroless plating can then deposit metal onto the portion of the surface of substrate coated with the catalyst solution. Electrolytic plating can then deposit additional metal onto the portion of the surface of substrate coated with the catalyst solution. However, Chen et al. also do not suggest that the catalyst described in their invention can be used in a process to produce RF antennae or smart card circuitry.

Thus, there remains a need in the art for an improved catalytic ink composition and for an improved process of using the catalytic ink composition to produce RF antennae and circuitry for wireless articles that overcomes many of the drawbacks of the prior art.

SUMMARY OF THE INVENTION

The method generally comprises a method for providing a pattern of a metal on a non-conductive substrate comprising the steps of:
a) catalyzing the non-conductive substrate by applying a catalytic ink comprising a source of catalytic metal ions in the desired pattern on a surface of the non-conductive substrate;
b) reducing the source of catalytic metal ions in the catalytic ink to its associated metal;
c) depositing electroless metal on the pattern of catalytic ink on the surface of the substrate; and
d) plating electrolytic metal on the electroless metal layer to a desired thickness to produce the desired pattern of metal on the non-conductive substrate.

In a preferred embodiment, the catalytic metal ions comprise ionic palladium, which may be reduced to palladium. Other catalytic metal ions, including gold, platinum, silver and copper that may be reduced to their associated metal are also usable in the invention. Alternatively, catalytic metal itself may be directly included in the catalytic ink.

In one embodiment, the catalytic ink is screen printed in the desired pattern, i.e., the antenna pattern, and allowed to dry. Other printing means, including gravure, lithography and flexography may also be used to print the catalytic ink in the desired pattern.

The catalytic ink of the invention typically comprises:
a) one or more solvents;
b) a source of catalytic metal ions such as palladium, gold, platinum, silver, copper, etc.;
c) a crosslinking agent;
d) one or more copolymers;
e) a polyurethane polymer; and
f) optionally, one or more fillers.

Alternatively, the pattern of metal on the non-conductive substrate may be providing using a method comprising the steps of:
a) catalyzing the non-conductive substrate by applying a catalytic ink comprising a source of catalytic metal ions in a solid pattern with an outline of the desired pattern on a surface of the non-conductive substrate;
b) reducing the source of catalytic metal ions in the catalytic ink to its associated metal;
c) depositing electroless metal on the pattern of catalytic ink on the surface of the substrate;
d) plating electrolytic metal on the electroless metal layer to a desired thickness to produce the desired pattern of metal on the non-conductive substrate
e) printing a UV etch resist with the desired pattern; and
f) etching away the plated metal between the resist to define the desired circuit.

In a preferred embodiment, the catalytic metal ions comprise ionic palladium, which may be reduced to palladium metal. Other catalytic metal ions, including gold, platinum, silver, and copper that may be reduced to their associated metal are also usable in the invention. Alternatively, catalytic metal itself may be directly included in the catalytic ink.

The catalytic ink formulation of the invention may also be used to plate circuitry on phone cards without the use of conventional palladium activation tanks.

In this embodiment, the phone card is manufactured according to the following steps:
a) applying catalytic ink comprising a source of catalytic metal ions to the non-conductive substrate and allowing the catalytic ink to dry;
b) reducing the source of metal (i.e., palladium) in the ink to metal in a zero valence state (i.e., palladium metal) as described above;
c) printing a resist on the phone card to produce circuitry with gaps in the lines for "fuses;"
d) depositing electroless nickel on the exposed (non-covered areas of the catalytic ink); and
e) plating electrolytic tin/lead on top of the electroless nickel.

DETAILED DESCRIPTION OF THE PREFERRED EMBODIMENTS OF THE INVENTION

Figure 2:
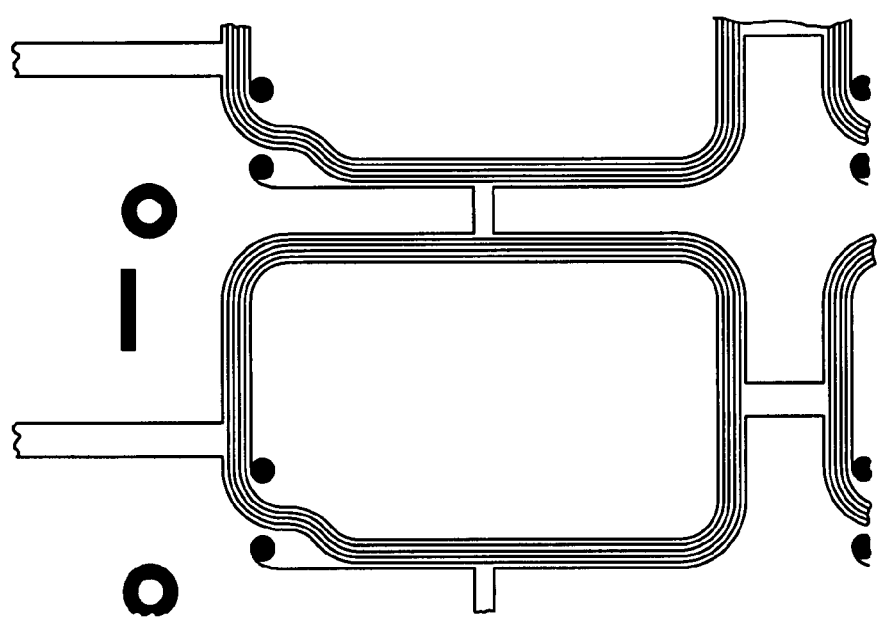
FIG. 2 depicts a different view of the RF antennae on the non-conductive substrate manufactured by the process of the instant invention.

The present invention relates to various methods of providing a pattern of a metal on a non-conductive substrate. The present invention can be used for creating loop antennae for wireless articles and for creating circuitry for smart cards, such as phone cards.

In a first embodiment, the method comprises the steps of:
a) catalyzing the non-conductive substrate by applying a catalytic ink comprising a source of catalytic metal ions in the desired pattern on a surface of the non-conductive substrate;
b) reducing the source of catalytic metal ions in the catalytic ink to its associated metal;
c) depositing electroless metal on the pattern of catalytic ink on the surface of the substrate; and
d) plating electrolytic metal on the electroless metal layer to a desired thickness to produce the desired pattern of metal on the non-conductive substrate.

Preferably the catalytic ink comprises ionic palladium, which may be reduced to palladium metal. Other catalytic metal ions including gold, platinum, silver, and copper that may be reduced to their associated metal are also usable in the invention. Alternatively catalytic metal itself may be directly included in the catalytic ink.

In a preferred embodiment, the catalytic ink is screen printed in the desired pattern, i.e., the antenna pattern, and allowed to dry. Other printing means, including gravure, lithography and flexography may also be used to print the catalytic ink in the desired pattern.

A typical formulation for the catalytic ink is as follows:
a) one or more solvents;
b) a source of catalytic metal ions, such as palladium, gold, platinum, silver, copper, etc.;
c) a crosslinking agent;
d) one or more copolymers;
e) a polyurethane polymer; and
f) optionally, one or more fillers.

The various ingredients of the ink formulation are discussed in more detail below.

After the catalytic ink is printed in the desired pattern, the source of catalytic metal ions (i.e., palladium), in the ink is reduced to metal (i.e., palladium at a zero valence state), by contacting the catalyzed substrate with a suitable reducing agent. Although various reducing agents are usable in the practice of the invention, the reducing agent preferably comprises sodium borohydride, dimethylamino borane, or hydrazine.

Next, electroless metal is deposited on the pattern of catalytic ink on the substrate. The electroless metal is generally selected from electroless nickel and electroless copper, although other electroless metal formulations are also usable in the practice of the invention. Suitable formulations of the electroless plating bath would be well known to those skilled in the art.

Finally, electrolytic metal is plated over the electroless metal deposit. A suitable electrolytic plating bath that is usable in the invention is an acid copper plating bath. The copper (or other metal) is typically plated to an antenna thickness of between about 0.5 and 0.7 mils and is selected to have a resistance of less than about 3.0 ohms. In the alternative, the electroless plating process can be used to build the entire desired thickness required.

Because of the difficulties in getting an uniform copper thickness when plating the antenna coils electrolytically, the invention also includes a second embodiment that may avoid this problem.

In this second embodiment, the method comprises the steps of:
a) catalyzing the non-conductive substrate by applying a catalytic ink comprising a source of catalytic metal ions in a solid pattern with an outline of the desired pattern on a surface of the non-conductive substrate;
b) reducing the source of catalytic metal ions in the catalytic ink to its associated metal;
c) depositing electroless metal on the pattern of catalytic ink on the surface of the substrate;
d) plating electrolytic metal on the electroless metal layer to a desired thickness to produce the desired pattern of metal on the non-conductive substrate
e) printing a UV etch resist with the desired pattern; and
f) etching away the plated metal between the resist to define the desired circuit.

Preferably the catalytic metal ions comprise ionic palladium, which may be reduced to palladium metal. Other catalytic metal ions including gold, platinum, silver, and copper that may be reduced to their associated metal are also usable in the invention. Alternatively catalytic metal itself may be directly included in the catalytic ink);

As in the first embodiment, the catalytic ink is screen printed in the desired pattern, i.e., the antenna pattern, and allowed to dry. Other printing means, including gravure, lithography or flexography may also be used to print the catalytic ink in the desired pattern. In a preferred embodiment, the catalytic ink is screen printed in a solid band with the outline of the antenna and allowed to dry.

After the catalytic ink is printed in the desired pattern, the source of catalytic metal ions (i.e., palladium), in the ink is reduced to metal (i.e., palladium at a zero valence state) and electroless metal is deposited on the catalytic ink as described above.

Acid copper is electrolytically plated over the electroless metal for the solid antenna band to a thickness of about 0.5 to about 0.7 mils. Then, a UV etch resist is applied, preferably by screen printing, in the antenna pattern using a suitable UV etch resist, such as UV screen printable resists, dry film resists, or other UV resists. Finally, the plated copper is etch away between the resist to define the antenna circuit.

The catalytic ink formulation of the invention may also be used to plate circuitry on phone cards without the use of conventional palladium activation tanks. In a preferred embodiment, the phone card substrate comprises polyethylene terephthalate (PET), acrylonitrile-butadiene-styrene (ABS) or polyvinylidine chloride (PVC).

In a preferred embodiment, the PET phone card is manufactured according to the following steps:
  a) applying catalytic ink comprising a source of catalytic metal ions to the PET substrate and allowing the catalytic ink to dry;
  b) reducing the source of metal (i.e., palladium) in the ink to its associated metal (i.e., palladium metal) as described above;
  c) printing a resist on the phone card to produce circuitry with gaps in the lines for "fuses;"
  d) depositing electroless nickel on the exposed (non-covered areas of the catalytic ink; and
  e) plating electrolytic tin/lead on top of the electroless nickel.

The catalytic ink can be applied by blank screen printing or other means that would be known to one of skill in the art.

Each of the steps of the invention will now be described in greater detail below.

As discussed above, a typical formulation of the novel catalytic ink of the invention comprises:
  a) one or more solvents;
  b) a source of catalytic metal ions selected from the group consisting of palladium, gold, platinum, silver, copper and combinations of the foregoing;
  c) a crosslinking agent;
  d) one or more copolymers;
  e) a polyurethane polymer or binder; and
  f) optionally, one or more fillers.

The solvent used in the catalytic ink formulations of the invention is typically a fast evaporating solvent. In general, the solvent of the catalytic ink may be selected from the group consisting of aromatic and aliphatic hydrocarbons, glycerol, ketones, esters, glycol ethers, and esters of glycol ethers. More particularly, the solvent may comprise toluene, xylene, glycerol, acetone, methyl ethyl ketone, cyclohexanone, isophorone, butyl acetate, dioctyl phthalate, butyl glycolate, ethylene glycol monomethyl ether, diethylene glycol dimethyl ether, propylene glycol monomethyl ether, ethylene glycol acetate, propylene glycol monomethyl etheracetate, methyl propyl ketone, methyl amyl ketone and/or diacetone-alcohol. Other suitable solvents that are inert to the ingredients that make up the ink formulation and that are fast evaporating, i.e., having a boiling point of less than about 90° C. would be known to one skilled in the art. Mixtures of one more solvents may also be used. In a preferred embodiment, the solvent is cyclohexanone. The solvent is generally used in an amount of about 50 to about 80 percent by weight of the catalytic ink composition, preferably in an amount of about 55 to about 75 percent by weight. The amount of solvent used depends upon the expected cooling method.

In an alternate embodiment, instead of catalytic metal ions, catalytic metal particles themselves may be included in the ink thereby eliminating the need for subsequent reduction. However, the use of metal particles may make it more difficult to accurately print the ink.

In a preferred embodiment, the catalytic metal ions comprise palladium, and the source of palladium in the catalytic ink composition of the invention is generally selected from palladium chloride, palladium acetate, and palladium sulfate. In one embodiment, the source of palladium is a solution of about 10% to about 20% palladium chloride in water with hydrochloric acid. In an alternate embodiment, the source of palladium is a solution of about 0.1% to about 2% palladium acetate in cyclohexanone. While the source of palladium is described as being palladium chloride or palladium acetate, the invention is not limited to these compounds. Gold, platinum, silver and copper compounds are also contemplated by the inventors and would generally be known to one skilled in the art. Examples of these compounds can be found in U.S. Pat. No. 5,855,959 to Boecker et al., U.S. Pat. No. 5,518,760 to Ferrier et al., and in U.S. Pat. No. 5,443,865 to Tisdale, et al., the subject matter of each of which is herein incorporated by reference in its entirety. The source of palladium or other catalytic metal is generally used in an amount of about 1 to about 2 percent by weight of the catalytic ink formulation.

The crosslinking agent of the catalytic ink formulation typically comprises polyisocyanate. Other crosslinking agents may also be suitable for use in the invention, including peroxides, e.g., benzoylperoxide, methyl ethyl ketone peroxide, etc. As an illustration of isocyanate crosslinking agents, the following isocyanates are typical: the various isomeric toluene diisocyanates and mixtures thereof; hexamethyl diisocyanate; diphenylmethane diisocyanate; an adduct of trimethylolpropane and toluene diisocyanate, etc. The crosslinking agent is generally used in an amount of about 1 to about 3 percent by weight.

When crosslinking with isocyanate, crosslinking occurs through the terminal —OH groups of the ink polyester moiety and a small portion through the substrate —OH moiety as well as hydroxyl groups on other components. Inasmuch as an isocyanate may be a polyfunctional isocyanate with 2 to 4 and even more isocyanate groups, the reaction produces a well crosslinked ink sufficiently adhering to a typical substrate, such as Mylar® (a polyethylene terephthalate film available from DuPont).

The copolymer may be selected from the group consisting of acrylic copolymers, ethylene copolymers with acrylate or vinyl acetate, chlorinated or unchlorinated copolymers of vinyl chloride and other similar compounds, used alone or in combination. In a preferred embodiment, the copolymer comprises vinyl chloride and hydroxylpropyl acrylate. The copolymer generally comprises about 3 to about 10 percent by weight of the catalytic ink formulation.

The catalytic ink formulation also comprises a polyurethane polymer. The polyurethane polymer is typically dissolved in the solvent of the catalytic ink formulation, i.e., cyclohexanone. The polyurethane/solvent mixture is typically present in an amount of about 3 to about 10 percent by weight of the catalytic ink formulation.

The catalytic ink composition of the invention also contains one or more fillers that may be selected from the group consisting of talc, oxides of manganese, titanium, magnesium, aluminum, bismuth, copper, nickel, tin, zinc, and silicon, silicates, bentonites, chalk, conductive carbon black, and mixtures of the foregoing. In a preferred embodiment, the one or more fillers comprise talc and fumed silica. The fillers generally comprise about 10 to about 30 percent by weight of the catalytic ink formulation. Preferably about 15 to about 25 percent by weight talc and about 0 to about 5 percent by weight of fumed silica is used in the catalytic ink formulation of the invention.

The catalytic ink formulation may be applied to the substrate in a variety of ways, such as dipping, spraying, slide coating, slot coating, roll coating, Meyer-rod coating, gravure coating, and draw-down processes known to those skilled in the art can coat an entire surface of the substrate. Full coating can result in full metallization of the substrate surface. Etching processes known to those skilled in the art can be used to remove selected portions of the full coating if a patterned metallization is required. Alternatively, processes such as screen printing, flexographic printing, plotting, ink-jet printing, and gravure printing can apply catalyst solution to only selected portions of the substrate surface. The substrate surface will be metallized only where the catalyst solution was applied. Accordingly, a patterned application of catalyst solution can result in patterned substrate metallization.

The viscosity of the (thixotropic) catalytic ink formulation of the invention is preferably in the range of about 1000 to about 8000 cp, preferably about 3000 to about 6000 cp (at a shear rate of 200 sec$^{-1}$), to allow the ink to be screen printed onto the substrate. If other means, such as gravure, lithography, or flexography, are used for printing the catalytic ink formulation onto the substrate, the viscosity of the catalytic ink formulation is adjusted accordingly for the chosen printing method.

The non-conductive substrate may be formed from a polymer, such as polyimide, polyethylene terephthalate (PET), Mylar®, polyester, polycarbonate, ABS, PVC, paper or coated paper and other similar substrates that are known in the art. It is preferable to use an elastic material so that the system is flexible. In one preferred embodiment, the non-conductive substrate is polyethylene terephthalate. The substrate is typically about 0.75 mm thick (about 0.03 inch thick), but may range between 0.05 and 1.0 mm thick (about 0.002 to 0.040 inch thick, i.e. 2-40 mils). Other substrates which may be employed include polyimide, polyimide-amide, polyparabanic acid, polycarbonate, polysulfones, polyamine, cellulose triacetate, etc.

Next, the source of the catalytic metal ions in the catalytic ink formulation is reduced to its associated metal (otherwise known as "activation") using a suitable reducing/activating agent. The reducing agent preferably comprises sodium borohydride. Other reducing agents that may be usable in the practice of the invention include hydrazine, hydrazine hydrate, hydrazine sulfate with sodium hydroxide, and dihydrazine sulfate.

Activation accomplishes several important tasks:
1) It produces catalytic metallic (i.e., palladium) clusters by reducing the catalytic metal ion to its associated metal and by diffusion of the metal to form clusters by nucleation and growth;
2) It polymerizes or otherwise cures the polymer carrier in the catalyst coating to foster cohesive strength within the cured carrier; and
3) It fosters interdiffusion of molecules between the substrate and the polymer carrier, causing enhanced adhesion between the substrate and the cured polymer carrier.

After activation, an electroless plating processes can be used to deposit metal onto the catalyzed and activated substrate. Electroless plating processes are generally well known to those skilled in the art. The electroless metal that is plated over the catalytic ink is typically selected from the group consisting of electroless copper, electroless nickel, and combinations thereof. Bath compositions for electroless copper are disclosed, for example, in U.S. Pat. No. 4,368,281 to Brummett et al., the subject matter of which is herein incorporated by reference in its entirety. Bath compositions for other metals which may be deposited electroless deposition, including gold, silver, and palladium, are also disclosed in the prior art, such as in U.S. Pat. No. 3,937,857 to Brummett et al., the subject matter of which is herein incorporated by reference in its entirety.

Electrolytic plating is then used to deposit additional metal to the desired thickness on the seed metal layer formed by electroless plating. Electrolytic plating is more efficient (has a higher plating rate) than electroless plating. Electrolytic plating processes comprise applying an electric current through an anode to provide electrons needed in the reduction chemical reaction at the cathode and are known to those skilled in the art.

The electrolytic metal is generally plated using an acid copper plating bath. Alternatively, the copper deposit may be further plated with an electroless deposit of palladium or gold. Suitable electrolytic plating baths are also described in U.S. Pat. No. 4,368,381 to Brummett et al., the subject matter of which is herein incorporated by reference in its entirety.

Typically, the resistance of the electrolytically plated metal deposit is less than about 3.0 ohms.

Figure 1:
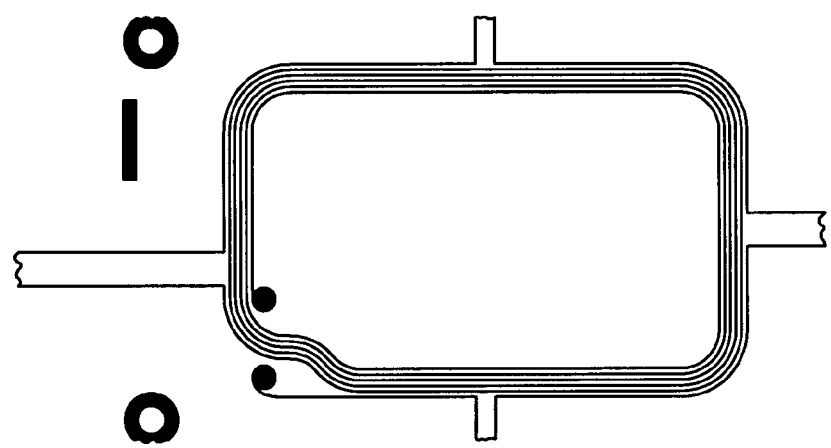
FIG. 1 depicts an RF antennae on a non-conductive substrate manufactured by the process of the instant invention.
Figure 3:
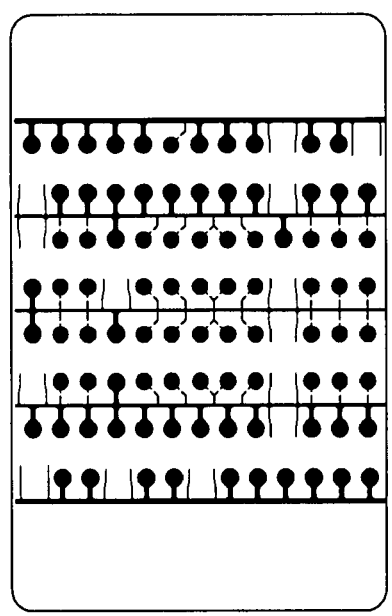
FIG. 3 depicts a phone card made by the process of the instant invention.
Figure 4:
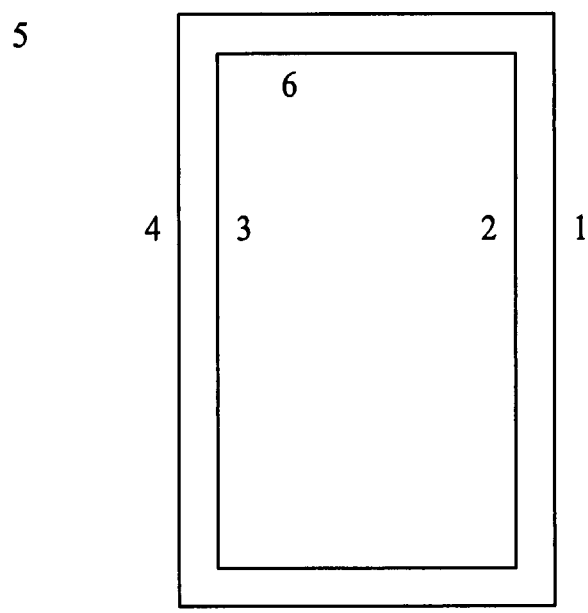
FIG. 4 depicts the location of measurements of the thickness of the copper deposit at six locations on the RF antennae.

FIGS. 1-3 depict various views of the RF antennae and circuitry produced on non-conductive substrates using the process of the instant invention. FIGS. 1 and 2 set forth samples of two RF antennae produced according to the process of the instant invention. For each of the RF antennae, measurements of thickness of the copper deposit were obtained at six locations on the RF antenna (these six locations are set forth in FIG. 4). The results of these measurements are presented in Tables 1 and 2.

TABLE 1

Readings Taken on RF Antenna depicted in FIG. 1

| Reading | mil Cu |
| --- | --- |
| 1 | 1.321 |
| 2 | 0.963 |
| 3 | 0.469 |
| 4 | 0.261 |
| 5 | 0.193 |
| 6 | 0.183 |

TABLE 2

Readings Taken on RF Antenna depicted in FIG. 2

| Reading | mil Cu |
| --- | --- |
| 1 | 0.522 |
| 2 | 0.503 |
| 3 | 0.812 |
| 4 | 0.911 |
| 5 | 0.832 |
| 6 | 0.659 |

FIG. 3 depicts the circuitry of an actual phone card. Measurements of thickness of the electrolytic tin/lead deposit were obtained at five locations phone card circuitry, and the results are presented in Table 3.

TABLE 3

Readings Taken on Phone Card Circuitry Depicted in FIG. 3

| Reading | mil SnPb | % Sn | % Pb |
|---|---|---|---|
| 1 | 0.413 | 79.600 | 20.402 |
| 2 | 0.424 | 78.763 | 21.242 |
| 3 | 0.426 | 78.374 | 21.631 |
| 4 | 0.431 | 78.324 | 21.682 |
| 5 | 0.434 | 79.071 | 20.935 |
| Average | 0.426 | 78.826 | 21.178 |

In order to produce a catalytic ink composition that has a long shelf life, the catalytic ink may be used as a two-component system, wherein the reactants are stored in separate formulations, which are then mixed only just before application. The reaction then takes place spontaneously or is accelerated by heat and/or a suitable catalyst.

What is claimed is:

1. A method of providing a pattern of a metal on a non-conductive substrate, the method comprising the steps of:
   a) applying a catalytic ink in a desired pattern on a surface of the non-conductive substrate, wherein the catalytic ink comprises:
      i) a solvent;
      ii) a source of catalytic metal ions;
      iii) a crosslinking agent;
      iv) a copolymer; and
      v) a polyurethane polymer;
   b) reducing the source of catalytic metal ions to its associated metal with a suitable reducing agent;
   c) depositing electroless metal on the pattern of catalytic ink; and
   d) plating electrolytic metal on top of the electroless metal layer to a desired thickness to produce the pattern of metal on the non-conductive substrate.

2. The method according to claim 1, wherein the catalytic ink is applied by screen printing, gravure, lithography or flexography.

3. The method according to claim 1, wherein the solvent is selected from the group consisting of aromatic and aliphatic hydrocarbons, glycerol, ketones, esters, glycol ethers, and esters of glycol ethers.

4. The method according to claim 3, wherein the solvent is selected from the group consisting of toluene, xylene, glycerol, methyl ethyl ketone, cyclohexanone, butyl acetate, dioctyl phthalate, butyl glycolate, ethylene glycol monomethyl ether, diethylene glycol dimethyl ether, propylene glycol monomethyl ether, ethylene glycol acetate, propylene glycol monomethyl ether-acetate, acetone, isophorone, methyl propyl ketone, methyl amyl ketone, diacetone-alcohol, and combinations of the foregoing.

5. The method according to claim 4, wherein the solvent is cyclohexanone.

6. The method according to claim 1, wherein the catalytic metal ions are selected from the group consisting of palladium, gold, silver, platinum, copper, and combinations of the foregoing.

7. The method according to claim 6, wherein the catalytic metal ions comprise palladium.

8. The method according to claim 7, wherein the soiree of palladium is selected from the group consisting of palladium dichloride and palladium acetate.

9. The method according to claim 8, wherein the source of palladium is a solution of about 10% to about 20% palladium dichloride in water with hydrochloric acid.

10. The method according to claim 8, wherein the source of palladium is a solution of about 0.1% to about 2% palladium acetate in cyclohexanone.

11. The method according to claim 1, wherein the crosslinking agent is a polyisocyanate.

12. The method according to claim 1, wherein the copolymer comprises vinyl chloride and hydroxylpropyl acrylate.

13. The method according to claim 1, wherein the catalytic ink comprises one or more fillers selected from the group consisting of talc, oxides of manganese, titanium, magnesium, aluminum, bismuth, copper, nickel, tin, zinc, and silicon, silicates, bentonites, chalk, carbon black, and combinations of the foregoing.

14. The method according to claim 13, wherein the one or more fillers comprise talc and fumed silica.

15. The method according to claim 1, wherein the non-conductive substrate is selected from the group consisting of polyimide, polyethylene terephthalate, polyesters, acrylonitrile-butadiene-styrene, polyvinylidine chloride, paper and polycarbonates.

16. The method according to claim 15, wherein the non-conductive substrate is polyethylene terephthalate.

17. The method according to claim 1, wherein the source of catalytic metal ions is reduced to its associated metal with a reducing agent selected from the group consisting of sodium borohydride, hydrazine, hydrazine hydrate, hydrazine sulfate, and dihydrazine sulfate.

18. The method according to claim 17, wherein the reducing agent is sodium borohydride.

19. The method according to claim 1, wherein the electroless metal is selected from the group consisting of electroless copper, electroless nickel, and combinations thereof.

20. The method according to claim 1, wherein the electrolytic metal is plated using an acid copper plating bath.

21. A method of providing a pattern of a metal on a non-conductive substrate, the method comprising the steps of:
   a) applying a catalytic ink in a solid pattern with an outline of the desired pattern on a surface of the non-conductive substrate, wherein the catalytic ink comprises:
      i) one or more solvents;
      ii) a source of catalytic metal ions;
      iii) a polyisocyanate crosslinking agent;
      iv) a copolymer, wherein the copolymer is capable of crosslinking with the polyisocyanate; and
      v) a polyurethane polymer;
   b) reducing the source of catalytic metal ions to its associated metal with a suitable reducing agent;
   c) depositing electroless metal on the pattern of catalytic ink on the surface of the substrate;
   d) plating electrolytic metal on the electroless metal layer to a desired thickness to produce the desired pattern of metal on the non-conductive substrate
   e) printing a UV etch resist with the desired pattern; and
   f) etching away the plated metal between the resist to define the desired circuit.

22. The method according to claim 21, wherein the catalytic ink is applied by screen printing, gravure, lithography, or flexography.

23. The meted according to claim 21, wherein the solvent is selected from the group consisting of aromatic and aliphatic hydrocarbons, glycerol, ketones, esters, glycol ethers, and esters of glycol ethers.

24. The method according to claim 23, wherein the solvent is selected from the group consisting of toluene, xylene, glycerol, methyl ethyl ketone, cyclohexanone, butyl acetate, dioctyl phthalate, butyl glycolate, ethylene glycol monomethyl ether, diethylene glycol dimethyl ether, propylene glycol monomethyl ether, ethylene glycol acetate, propylene glycol monomethyl ether-acetate, acetone, isophorone, methyl propyl ketone, methyl amyl ketone, diacetone-alcohol and combinations of the foregoing.

25. The method according to claim 24, wherein the solvent is cyclohexanone.

26. The method according to claim 21, wherein the catalytic metal ions are selected from the group consisting of palladium, gold, silver, platinum, copper, and combinations of the foregoing.

27. The method according to claim 26, wherein the catalytic metal ions comprise palladium.

28. The method according to claim 27, wherein the source of palladium is selected from the group consisting of palladium dichloride and palladium acetate.

29. The method according to claim 28, wherein the source of palladium is a solution of about 10% to about 20% palladium dichloride in Water with hydrochloric acid.

30. The method according to claim 28, wherein the source of palladium is a solution of about 0.1% to about 2% palladium acetate in cyclohexanone.

31. The method according to claim 21, wherein the copolymer comprises vinyl chloride and hydroxylpropyl acrylate.

32. The method according to claim 21, wherein the catalytic ink comprises one or more fillers selected from the group consisting of talc, oxides of manganese, titanium, magnesium, aluminum, bismuth, copper, nickel, tin, zinc, and silicon, silicates, bentonites, chalk, carbon black, and combinations of the foregoing.

33. The method according to claim 32, wherein the one or more fillers comprise talc and fumed silica.

34. The method according to claim 21, wherein the non-conductive substrate is selected from the group consisting of polyimides, polyethylene terephthalate, polyesters, acrylonitrile-butadiene-styrene, polyvinylidine chloride, and polycarbonates.

35. The method according to claim 34, wherein the non-conductive substrate is polyethylene terephthalate.

36. The method according to claim 21, wherein the source of catalytic metal ions is reduced to its associated metal with a reducing agent selected from the group consisting of sodium borohydride, hydrazine, hydrazine hydrate, hydrazine sulfate, and dihydrazine sulfate.

37. The method according to claim 36, wherein the reducing agent is sodium borohydride.

38. The method according to claim 21, wherein the electroless metal is selected from the group consisting of electroless copper, electroless nickel, and combinations thereof.

39. The method according to claim 21, wherein the electrolytic metal is plated using an acid copper plating bath.

40. A method of providing a desired pattern of metal on a non-conductive substrate comprising the steps of:
 a) applying a catalytic ink on a surface of the non-conductive substrate, wherein the catalytic ink comprises:
  i) a solvent;
  ii) a source of catalytic metal ions;
  iii) a crosslinking agent;
  iv) a copolymer; and
  v) a polyurethane polymer,
 b) reducing the source of catalytic metal ions to its associated metal using a suitable reducing agent;
 c) printing resist in a desired pattern on the catalytic ink on the non-conductive substrate;
 d) depositing electroless metal on the non-conductive substrate in the areas not covered by the printed resist on the catalytic Ink; and
 e) plating electrolytic metal on top of the electroless metal deposit.

41. The method according to claim 40, wherein the catalytic ink is applied by screen printing, gravure, lithography, or flexography.

42. The method according to claim 40, wherein the solvent is selected from the group consisting of aromatic and aliphatic hydrocarbons, glycerol, ketones, esters, glycol ethers, and esters of glycol ethers.

43. The method according to claim 42, wherein the solvent is selected from the group consisting of toluene, xylene, glycerol, methyl ethyl ketone, cyclohexanone, butyl acetate, dioctyl phthalate, butyl glycolate, ethylene glycol monomethyl ether, diethylene glycol dimethyl ether, propylene glycol monomethyl ether, ethylene glycol acetate, propylene glycol monomethyl ether-acetate, acetone, isophorone, methyl propyl ketone, methyl amyl ketone, diacetone-alcohol and combinations of the foregoing.

44. The me thod according to claim 43, wherein the solvent is cyclohexanone.

45. The method according to claim 40, wherein the catalytic metal ions are selected from the group consisting of palladium, gold, silver, platinum, copper, and combinations of the foregoing.

46. The method according to claim 45, wherein the catalytic metal ions comprise palladium.

47. The method according to claim 46, wherein the source of palladium is selected from the group consisting of palladium dichloride and palladium acetate.

48. The method according to claim 47, wherein the source of palladium is a solution of about 10% to about 20% palladium dichloride in water with hydrochloric acid.

49. The method according to claim 47, wherein the source of palladium is a solution of about 0.1% to about 2% palladium acetate in cyclohexanone.

50. The method according to claim 40, wherein the crosslinking agent is a polyisocyanate.

51. The method according to claim 40, wherein the copolymer comprises vinyl chloride and hydroxylpropyl acrylate.

52. The method according to claim 40, wherein the catalytic ink comprises one or more fillers selected from the group consisting of talc, oxides of manganese, titanium, magnesium, aluminum, bismuth, copper, nickel, tin, zinc, and silicon, silicates, bentonites, chalk, carbon black, and combinations of the foregoing.

53. The method according to claim 52, wherein the one or more tillers comprise talc and finned silica.

54. The method according to claim 40, wherein the non-conductive substrate is selected from the group consisting of polyimide, polyethylene terephthalate, polyesters, acrylonitrile-butadiene-styrene, polyvinylidine chloride, and polycarbonates.

55. The method according to claim 54, wherein the non-conductive substrate is polyethylene terephthalate.

56. The method according to claim 40, wherein the source of catalytic metal ions is reduced to its associated metal with a reducing agent selected from the group consisting of sodium borohydride, hydrazine, hydrazine hydrate, hydrazine sulfate, and dihydrazine sulfate.

57. The method according to claim 56, wherein the reducing agent is sodium borohydride.

58. The method according to claim 40, wherein the electroless metal is selected from the group consisting of electroless copper, electroless nickel, and combinations thereof.

59. The method according to claim 40, wherein the electrolytic metal is plated using an acid copper plating bath.

* * * * *

UNITED STATES PATENT AND TRADEMARK OFFICE
CERTIFICATE OF CORRECTION

PATENT NO.         : 7,255,782 B2  
APPLICATION NO. : 10/837109  
DATED                 : August 14, 2007  
INVENTOR(S)        : Kenneth Crouse It is certified that error appears in the above-identified patent and that said Letters Patent is hereby corrected as shown below:

Column 12

Line 1, delete "soiree" and replace it with --source--

Column 14

Line 60, delete "tillers" and replace it with --fillers--

Line 60, delete "finned" and replace it with --fumed--

Line 63, delete "polyimide," and replace it with --polyimides,--

Signed and Sealed this

Sixth Day of November, 2007

JON W. DUDAS  
*Director of the United States Patent and Trademark Office*